(12) United States Patent
Deore et al.

(10) Patent No.: US 11,505,712 B2
(45) Date of Patent: Nov. 22, 2022

(54) COPPER INK

(71) Applicant: National Research Council of Canada, Ottawa (CA)

(72) Inventors: Bhavana Deore, Ottawa (CA); Chantal Paquet, Ottawa (CA); Patrick Malenfant, Orleans (CA)

( * ) Notice: Subject to any disclaimer, the term of this patent is extended or adjusted under 35 U.S.C. 154(b) by 178 days.

(21) Appl. No.: 16/634,934

(22) PCT Filed: Jul. 31, 2018

(86) PCT No.: PCT/IB2018/055727
§ 371 (c)(1),
(2) Date: Jan. 29, 2020

(87) PCT Pub. No.: WO2019/025970
PCT Pub. Date: Feb. 7, 2019

(65) Prior Publication Data
US 2021/0095153 A1    Apr. 1, 2021

Related U.S. Application Data

(60) Provisional application No. 62/539,610, filed on Aug. 1, 2017.

(51) Int. Cl.
*C09D 11/52* (2014.01)
*C23C 18/14* (2006.01)
(Continued)

(52) U.S. Cl.
CPC ............... *C09D 11/52* (2013.01); *B41M 1/12* (2013.01); *B41M 3/00* (2013.01); *B41M 7/0081* (2013.01);
(Continued)

(58) Field of Classification Search
None
See application file for complete search history.

(56) References Cited

U.S. PATENT DOCUMENTS

| 4,248,921 A | 2/1981 | Steigerwald et al. |
| 4,913,938 A | 4/1990 | Kawakami et al. |

(Continued)

FOREIGN PATENT DOCUMENTS

| CN | 103084581 A | 5/2013 |
| EP | 2826885 A1 | 1/2015 |

(Continued)

OTHER PUBLICATIONS

Search Report dated Nov. 12, 2021 and First Examination Report dated Nov. 19, 2021 on Chinese application 2018800581650.
(Continued)

*Primary Examiner* — Joshua D Zimmerman
(74) *Attorney, Agent, or Firm* — Brunet & Co., Ltd.; Hans Koenig; Robert Brunet

(57) ABSTRACT

A copper-based ink contains copper hydroxide and diethanolamine. The ink may be coated on a substrate and decomposed on the substrate to form a conductive copper coating on the substrate. The ink is low cost and micron-thick traces of the ink may be screen printed and thermally sintered in the presence of up to about 500 ppm of oxygen or photosintered in air to produce highly conductive copper features. Sintered copper traces produced from the ink have improved air stability compared to traces produced from other copper inks. Sintered copper traces having sheet resistivity of about 20 mΩ/□/mil or less may be obtained for 5-20 mil wide screen-printed lines with excellent resolution.

21 Claims, 7 Drawing Sheets

(51) Int. Cl.
| | |
|---|---|
| B41M 1/12 | (2006.01) |
| B41M 3/00 | (2006.01) |
| B41M 7/00 | (2006.01) |
| C09D 11/037 | (2014.01) |
| C09D 11/104 | (2014.01) |
| H05K 1/09 | (2006.01) |
| H05K 3/12 | (2006.01) |

(52) U.S. Cl.
CPC .......... *C09D 11/037* (2013.01); *C09D 11/104* (2013.01); *C23C 18/143* (2019.05); *H05K 1/095* (2013.01); *H05K 3/12* (2013.01)

(56) References Cited

U.S. PATENT DOCUMENTS

| | | | |
|---|---|---|---|
| 5,045,236 | A | 9/1991 | Tsunaga et al. |
| 6,036,889 | A | 3/2000 | Kydd |
| 7,566,357 | B2 | 7/2009 | Zhao |
| 7,566,375 | B2 | 7/2009 | Huang |
| 7,691,294 | B2 | 4/2010 | Chung et al. |
| 8,043,535 | B2 | 10/2011 | Kamikoriyama et al. |
| 8,597,397 | B2 | 12/2013 | Kunze et al. |
| 2006/0078686 | A1 | 4/2006 | Hodge et al. |
| 2006/0236813 | A1 | 10/2006 | Zhao et al. |
| 2008/0134936 | A1 | 6/2008 | Kamikoriyama et al. |
| 2008/0178761 | A1 | 7/2008 | Tomotake et al. |
| 2009/0242854 | A1* | 10/2009 | Li .................... C09D 11/101 252/519.33 |
| 2015/0056426 | A1 | 2/2015 | Grouchko et al. |
| 2016/0081189 | A1 | 3/2016 | Shimoda et al. |

FOREIGN PATENT DOCUMENTS

| | | | |
|---|---|---|---|
| JP | H01168867 A | | 7/1989 |
| JP | H01168868 A | | 7/1989 |
| JP | 2004259464 A | | 9/2004 |
| JP | 2009256779 A | | 11/2009 |
| JP | 2014051569 A | * | 3/2014 |
| JP | 2014051569 A | | 3/2014 |
| JP | 2014148732 A | | 8/2014 |
| JP | 2014182913 A | * | 9/2014 .............. H05K 1/092 |
| WO | 2010/032937 A2 | | 3/2010 |
| WO | 2013/128449 A2 | | 9/2013 |
| WO | 2014/034996 A1 | | 3/2014 |
| WO | 2015/137013 A1 | | 9/2015 |

OTHER PUBLICATIONS

International Search Report and Written Opinion dated Feb. 7, 2019 on PCT/IB2018/055727.
Albrecht A, et al. J. Mater. Chem. C. 2016, 4, 3546.
Chen W, et al. Journal of Electronic Materials, vol. 44, No. 7, 2015, 2479-2487.
Chung W-H, et al. Thin Solid Films 580 (2015) 61-70.
Chung W-H, et al. Nanotechnology 27 (2016) 205704 (13 pp).
Curtis C, et al. Metallizations by Direct-Write Inkjet Printing. Presented at the NCPV Program Review Meeting Lakewood, Colorado, Oct. 14-17, 2001.
Dang Z-M, et al. Journal of Applied Polymer Science, vol. 126, 815-821 (2012).
Farraj Y, et al. Chem. Commun., 2015, 51, 1587.
Abstract of Hokita Y, et al. ACS Appl. Mater. Interfaces, 2015, 7(34), 19382-19389.
Hu Y, et al. Application of Nano Copper Conductive Ink for Printed Electronics. (2014) 15th International Conference on Electronic Packaging Technology.
Kawaguchi Y, et al. Journal of Coating Science and Technology, 2016, 3, 56-61.
Kim Y, et al. Current Applied Physics. 12 (2012) 473-478.
Kim CS, et al. ACS Appl. Mater. Interfaces. (2016) 8, 22295-22300.
Lee B, et al. Current Applied Physics 9 (2009) e157-e160.
Li W, et al. J. Mater. Chem. C. 2016, 4, 8802.
Pajor-Swierzy A, et al. Air stable copper-silver core-shell submicron particles: Synthesis and conductive ink formulation. Colloids and Surfaces A: Physiochemical and Engineering Aspects. (2016) 9 pp.
Schulz DL, et al. Electrochemical and Solid-State Letters, 4 (8) C58-C61 (2001).
Shin D-H, et al. ACS Appl. Mater. Interfaces 2014, 6, 3312-3319.
Suren S, et al. Thin Solid Films. 607 (2016) 36-42.
Tam SK, et al. J Mater Sci (2017) 52:5617-5625.
Tsai C-Y, et al. Nanoscale Research Letters (2015) 10:357.
Wen Y, et al. Materials Science and Engineering B. 177 (2012) 619-624.
Yabuki A, et al. Materials Research Bulletin. 47 (2012) 4107-4111.
Yabuki A, et al. Synthesis of copper conductive film by low-temperature thermal decomposition of coppereaminediol complexes under an air atmosphere. Materials Chemistry and Physics (2014) 6 pp.
Zhu X, et al. Langmuir 2012, 28, 14461-14469.
Extended European Search Report dated Mar. 17, 2021 on EP 18841557.4.
First Examination Report dated Oct. 7, 2021 on Indian application 202027004378.
Yim C, et al. ACS Appl. Mater. Interfaces 2016, 8, 22369-22373.
Search Report dated Feb. 7, 2022 and Office Action dated Feb. 10, 2022 on Taiwan application 107126333.
Office action dated May 11, 2022 on Chinese application 2018800581650.
Office action dated May 18, 2022 on Japanese application 2020-505466.
Office action dated Aug. 30, 2022 on Taiwan application 107126333.
Office action dated Sep. 30, 2022 on Chinese application 201880058165.0.

* cited by examiner

COPPER INK

CROSS-REFERENCE TO RELATED APPLICATIONS

This application is a National Entry of International Application PCT/162018/055727 filed Jul. 31, 2018, and claims the benefit of United States Provisional Application U.S. Ser. No. 62/539,610 filed Aug. 1, 2017.

FIELD

This application relates to printing inks, particularly to printing inks for printed electronics.

BACKGROUND

Low price, high conductivity and oxidation resistance are important targets for inks in printed electronics. Gold and silver are expensive but stable, i.e. resistant to oxidation. Compared to gold and silver, copper is cheaper and has a similar conductivity; however, the similar conductivity is often not achieved via printing and the copper is prone to oxidation, which reduces conductivity over time. The main types of copper inks used are metal nanoparticle-based inks, metal-organic decomposition (MOD) inks, copper flake inks and silver-coated copper flake inks.

Nanoparticle-based copper inks are generally expensive but are easily oxidized and require sintering at very high temperatures and or need laser/flash light sintering. Inexpensive versions (e.g. Novacentrix™) only screen print well on cardboard and must be photo-sintered. To prevent oxidation, bimetallic Ag—Cu nanoparticle inks have been proposed; but, such inks are still relatively expensive.

MOD inks enable thermal sintering at lower temperature but expensive copper precursors such as copper formate are typically used. Also, MOD inks are not typically viscous, which precludes screen printing. Corrosion caused by strong acid vapor i.e. formic acid and poor conductivity due to low metal content are other limitations often seen with Cu MOD inks. The main advantage of MOD inks over conventional flake/nanoparticle inks is that MOD compounds allow smooth films at low temperature sintering and produce high resolution features. However, MOD inks are mixtures of expensive metal salts, e.g. copper formate, and organic components, where copper loading in the ink formulation is low and can result in lower electrical conductivities of printed traces. Also, the slow reactivity of copper traces to atmospheric oxygen (i.e. oxidation) results in a decrease in conductivity of traces overtime.

Therefore, there is need for a low cost, high conductivity and oxidation resistant screen-printable ink that can be thermally and/or photo-sintered to produce conducting traces. Low cost copper inks that are screen-printable on plastic and can be photo-sintered or thermally sintered would have immediate commercial value.

SUMMARY

In one aspect, there is provided a copper-based ink comprising copper hydroxide and diethanolamine.

In another aspect, there is provided a method of producing a conductive copper coating on a substrate, the method comprising: coating a substrate with a copper-based ink comprising copper hydroxide and diethanolamine; and, decomposing the ink on the substrate to form a conductive copper coating on the substrate.

Advantageously, the ink is low cost and is capable of being formulated for screen printing applications. Micron-thick traces of the ink may be screen printed and thermally sintered in the presence of up to about 500 ppm of oxygen or photo-sintered in air to produce highly conductive copper features. Sintered copper traces produced from the ink have improved air stability compared to traces produced from other copper inks. The sintered copper traces have good adhesion strength. Copper nanoparticles and/or silver salts may be included to further increase conductivity and/or oxidation resistance of sintered copper traces, and/or to further enhance screen printability of the ink. Sintered copper traces having sheet resistivity of about 20 mΩ/□/mil or less may be obtained for 5-20 mil wide screen-printed lines with excellent resolution.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

Figure 1:
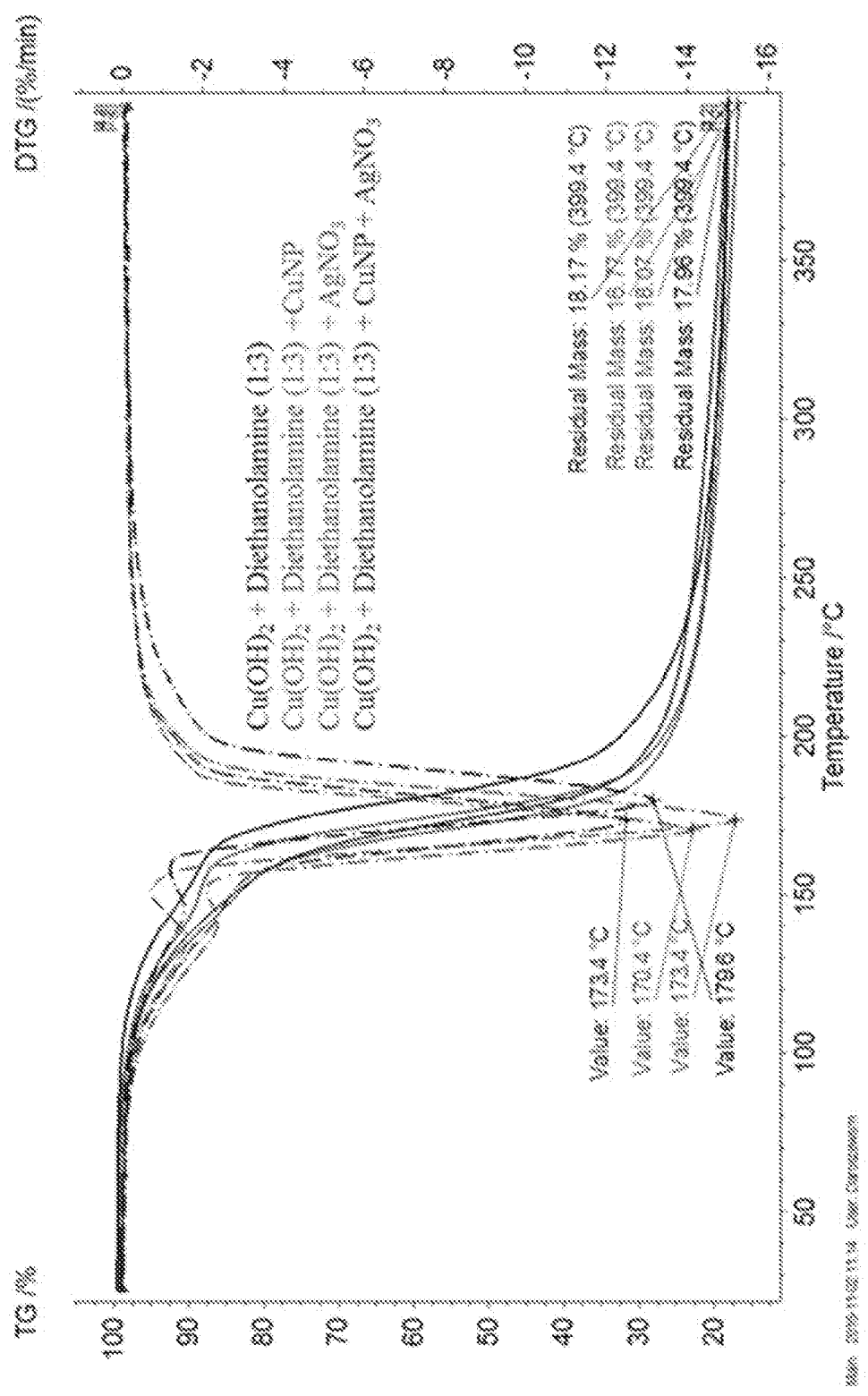
FIG. 1 depicts thermograms of various inks comprising copper hydroxide monohydrate ($Cu(OH)_2.H_2O$) and diethanolamine.

The copper-based ink comprises copper hydroxide and diethanolamine. The diethanolamine ($HN(CH_2CH_2H)_2$) is a readily available organic compound. The copper hydroxide ($Cu(OH)_2$) is a readily available inorganic compound and may be hydrated or not hydrated. Hydrated copper hydroxide may comprise a monohydrate ($Cu(OH)_2 \cdot H_2O$), which is convenient to use and less expensive than anhydrous copper hydroxide. In the ink, copper hydroxide and diethanolamine form a complex. The copper hydroxide is preferably present in the ink in an amount that provides about 5 wt % to about 40 wt % of copper, based on total weight of the ink. The amount of copper, which the copper hydroxide provides is more preferably in a range of about 10 wt % to about 30 wt %, based on total weight of the ink. Preferably, the copper hydroxide and diethanolamine are in the ink in a molar ratio of about 1:2.5 to about 1:3.5. More preferably, the molar ratio of copper hydroxide to diethanolamine is about 1:3. Such molar ratios are particularly advantageous for improving conductivity of conductive copper traces formed from the ink.

The ink may also comprise one or more other components useful for the formulation of inks for specific purposes or for improving electrical, physical and/or mechanical properties of conductive traces formed from the ink. In various embodiments, the ink may comprise one or more of a filler, a binder, a surface tension modifier, a defoaming agent, a thixotropy modifying agent, a solvent, or any mixture thereof.

The filler, for example another metal-containing compound or a mixture of other metal-containing compounds, may be present in the ink to improve conductivity of conductive traces formed from the ink. The filler may comprise copper nanoparticles (CuNP) or a metal salt. Copper nanoparticles (CuNP) are copper particles having an average size along a longest dimension in a range of about 1-1000 nm, preferably about 1-500 nm, more preferably about 1-100 nm. The copper nanoparticles, may be flakes, nanowires, needles, substantially spherical or any other shape. The metal salt is preferably a silver or gold salt, more preferably a silver salt. The metal salt comprises one or more anions, preferably anions derived from mineral acids. The anions in the metal salts are preferably oxide, chloride, bromide, sulfate, carbonate, phosphate, acetate or nitrate. Nitrates are particularly preferred. A particularly preferred metal salt filler is silver nitrate. The filler is preferably present in the ink in an amount of up to about 40 wt %, based on weight of copper from the copper hydroxide in the ink. Preferably, the amount of filler is in a range of about 1 wt % to about 40 wt %, or about 5 wt % to about 30 wt %, or about 10 wt % to about 30 wt %, based on weight of copper from the copper hydroxide in the ink.

The binder, for example an organic polymer binder, may be present in the ink as a processing aid for particular deposition processes. The organic polymer binder may be any suitable polymer, preferably a thermoplastic or elastomeric polymer. Some non-limiting examples of binders are cellulosic polymers, polyacrylates, polystyrenes, polyolefins, polyvinylpyrrolidone, polypyrrolidone, polyvinyl acetals, polyesters, polyimides, polyether imides, polyols, silicones, polyurethanes, epoxy resins, phenolic resins, phenol formaldehyde resins, styrene allyl alcohols, polyalkylene carbonates, fluoroplastics, fluoroelastomers, thermoplastic elastomers and mixtures thereof. The organic polymer binder may be homopolymeric or copolymeric. A particularly preferred binder comprises a polyester, polyimide, polyether imide or any mixture thereof. The polymeric binder preferably comprises a polyester. Suitable polyesters are commercially available or may be manufactured by the condensation of poly alcohols with poly carboxylic acid and respectively their anhydrides. Preferred polyesters are hydroxyl and/or carboxyl functionalized. The polyester may be linear or branched. Solid or liquid polyesters as well as diverse solution forms may be utilized. In a particularly preferred embodiment, the polymeric binder comprises a hydroxyl- and/or carboxyl-terminated polyester, for example Rokrapol™ 7075. The polymeric binder may be present in the ink in any suitable amount. The organic polymer binder may be present in the ink in any suitable amount, preferably in a range of about 0.05 wt % to about 10 wt %, based on total weight of the ink. More preferably, the amount is in a range of about 0.05 wt % to about 5 wt %, or about 0.2 wt % to about 2 wt %, or about 0.2 wt % to about 1 wt %. In one embodiment, the polymeric binder is present in the ink in an amount of about 0.02-0.8 wt %, more preferably about 0.05-0.6 wt %.

The surface tension modifier may be any suitable additive that improves flow and leveling properties of the ink. Some non-limiting examples are surfactants (e.g. cationic or anionic surfactants), alcohols (e.g. propanol), glycolic acid, lactic acid and mixtures thereof. The surface tension modifier may be present in the ink in any suitable amount, preferably in a range of about 0.1 wt % to about 5 wt %, based on total weight of the ink. More preferably, the amount is in a range of about 0.5 wt % to about 4 wt %, or about 0.8 wt % to about 3 wt %. In one especially preferred embodiment, the amount is in a range of about 1 wt % to about 2.7 wt %.

The defoaming agent may be any suitable anti-foaming additive. Some non-limiting examples are fluorosilicones, mineral oils, vegetable oils, polysiloxanes, ester waxes, fatty alcohols, glycerol, stearates, silicones, polypropylene based polyethers and mixtures thereof. Glycerol and polypropylene based polyethers are particularly preferred. In the absence of the defoaming agent, some printed traces may tend to retain air bubbles following printing, resulting in nonuniform traces. The defoaming agent may be present in the ink in any suitable amount, preferably in a range of about 0.0001 wt % to about 3 wt %, based on total weight of the ink. More preferably, the amount is in a range of about 0.005 wt % to about 2 wt %.

The thixotropy modifying agent may be any suitable thixotropy-modifying additive. Some non-limiting examples are polyhydroxycarboxylic acid amides, polyurethanes, acrylic polymers, latex, polyvinylalcohol, styrene/butadiene, clay, clay derivatives, sulfonates, guar, xanthan, cellulose, locust gum, acacia gum, saccharides, saccharide derivatives, cassein, collagen, modified castor oils, organosilicones and mixtures thereof. The thixotropy modifying agent may be present in the ink in any suitable amount, preferably in a range of about 0.05 wt % to about 1 wt %, based on total weight of the ink. More preferably, the amount is in a range of about 0.1 wt % to about 0.8 wt %. In one especially preferred embodiment, the amount is in a range of about 0.2 wt % to about 0.5 wt %.

The solvent may be an aqueous solvent or an organic solvent. In some instances, a mixture of one or more organic solvents with an aqueous solvent may be utilized. Aqueous solvents include, for example, water and solutions, dispersions or suspension of compounds in water. The organic solvent may be aromatic, non-aromatic or a mixture of aromatic and non-aromatic solvents. Aromatic solvents include, for example, benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof. Non-aromatic solvents include, for example, terpenes, glycol ethers (e.g. dipropylene glycol methyl ether, methylcarbitol, ethylcarbitol, butylcarbitol, triethyleneglycol and derivatives thereof), alcohols (e.g. methyicyclohexanois, octanois, heptanols) or any mixture thereof. Dipropylene glycol methyl ether is preferred. The solvent may be present in the ink in any suitable amount, preferably in a range of about 1 wt % to about 50 wt %, based on total weight of the ink. More preferably, the amount is in a range of about 2 wt % to about 35 wt %, or about 5 wt % to about 25 wt %. The solvent generally makes up the balance of the ink.

The ink may be formulated by mixing the components together in a mixer. Generally, any mixing process is suitable. However, planetary centrifugal mixing (e.g. in a Thinky™ mixer) is particularly useful. Mixing time may have some impact on the electrical properties of conductive traces formed from the ink. Properly mixing the ink ensures good electrical properties of the conductive traces. The mixing time is preferably about 25 minutes or less, or about 20 minutes or less, or about 15 minutes or less. The mixing time is preferably about 1 minute or more, or about 5 minutes or more.

Prior to decomposition, the ink is deposited on a substrate to coat the substrate. Suitable substrates may include, for example polyethylene terephthalate (PET) (e.g. Melinex™), polyolefin (e.g. silica-filled polyolefin (Teslin™)), polydimethylsiloxane (PDMS), polystyrene, acrylonitrile/butadiene/styrene, polycarbonate, polyimide (e.g. Kapton™), polyetherimide (e.g. Ultem™), thermoplastic polyurethane (TPU), silicone membranes, printed wiring board substrate (e.g. FR4), wool, silk, cotton, flax, jute, modal, bamboo, nylon, polyester, acrylic, aramid, spandex, polylactide, paper, glass, metal, dielectric coatings, among others.

The ink may be coated on the substrate by any suitable method, for example printing. Printing methods may include, for example, screen printing, stenciling, inkjet printing, flexography printing, gravure printing, off-set printing, stamp printing, airbrushing, aerosol printing, typesetting, or any other method. It is an advantage of the process that an additive method such as screen printing or stenciling are particularly useful. For printed electronic devices, the ink may be coated on the substrate as traces.

After coating the substrate with the ink, the ink on the substrate may be dried and decomposed to form a copper metal coating on the substrate. Drying and decomposition may be accomplished by any suitable technique, where the techniques and conditions are guided by the type of substrate and the particular composition of the ink. For example, drying and decomposing the ink may be accomplished by heating and/or photonic sintering.

In one technique, heating the substrate dries and sinters the ink coating to form metallic copper. Heating may be performed at a temperature of about 100° C. or higher, about 140° C. or higher, or about 165° C. or higher, or about 180° C. or higher, while producing conductive copper coatings that have good oxidation stability. The temperature may be in a range of about 140° C. to about 300° C., or about 150° C. to about 280° C., or about 160° C. to about 270° C., or about 180° C. to about 250° C. Heating is preferably performed for a time in a range of about 1-180 minutes, for example 5-120 minutes, or 5-90 minutes. Heating may be performed in stages to first dry the ink coating and then sinter the dried coating. Drying may be performed at any suitable temperature, for example at a temperature in a range of about 100° C. to about 150° C. Drying may be performed for any suitable length of time, for example about 1-180 minutes, or 5-90 minutes, or 10-45 minutes. Sintering is performed at a sufficient balance between temperature and time to sinter the ink to form conductive copper coatings. Drying and/or sintering may be performed with the substrate under an inert atmosphere (e.g. nitrogen and/or argon gas). However, improved air stability of the ink permits sintering in the presence of oxygen, for example in an atmosphere comprising up to about 500 ppm of oxygen. The type of heating apparatus also factors into the temperature and time required for drying and sintering.

In another technique, the ink coating may be dried with heat and then photonically sintered. Drying may be performed at any suitable temperature, for example at a temperature in a range of about 100° C. to about 150° C. Drying may be performed for any suitable length of time, for example about 1-180 minutes, or 5-90 minutes, or 10-45 minutes. A photonic sintering system may feature a high intensity lamp (e.g. a pulsed xenon lamp) that delivers a broadband spectrum of light. The lamp may deliver about 5-30 J/cm$^2$ in energy to the traces. Pulse widths are preferably in a range of about 0.58-1.5 ms. Photonic sintering nay be performed in air, or in an inert atmosphere. Laser sintering may be utilized, if desired. Photonic sintering is especially suited when polyethylene terephthalate or polyimide substrates are used.

A sintered copper coating formed from the ink may have a sheet resistivity of about 20 mΩ/□/mil or less, even about 15 mΩ/□/mil or less, for 5-20 mil wide screen-printed lines. Further, line resolution is excellent with changes in line width after sintering for 5-20 mil wide screen-printed lines of less than about 17%, or less than about 10%, or less than about 5%, or less than about 2.5%. Even when line widths are as low as about 5 mil, the change in line width after sintering may be less than about 17%, even less than about 5%, or even less than about 2.5%. Furthermore, the sintered copper coatings formed from the ink may be flexible, being able to pass the ASTM F1683-02 flex & crease test without any open circuit breaks (i.e. without open fails). A change in resistivity (R) of 20% or less is considered to be a pass in the ASTM F1683-02 flex & crease test. Open circuit breaks are defined as a total loss in conductivity (i.e. infinite resistivity).

The substrate having sintered copper coatings thereon may be incorporated into an electronic device, for example electrical circuits (e.g. printed circuit boards (PCBs), conductive bus bars (e.g. for photovoltaic cells), sensors (e.g. touch sensors, wearable sensors), antennae (e.g. RFID antennae), thin film transistors, diodes, smart packaging (e.g. smart drug packaging), conformable inserts in equipment and/or vehicles, and multilayer circuits and MIM devices including low pass filters, frequency selective surfaces, transistors and antenna on conformable surfaces that can withstand high temperatures.

EXAMPLES

Example 1—Preparation of Inks

Molecular inks were formulated by mixing copper hydroxide monohydrate (Aldrich) and diethanolamine (Aldrich) in a 1:3 molar ratio of copper hydroxide to diethanolamine and 0 wt % or 0.5 wt % of a carboxyl-terminated polyester binder (Rokrapol™ 7075 from Kramer) to the amount of Cu metal and 0 wt % or 10 wt % CuNP (TEKNA™ from Advanced Material Inc.) to the amount of Cu metal and 0 wt % to 10 wt % AgN$_3$ (Aldrich) to the amount of Cu metal in the total ink. The inks were mixed using a planetary centrifugal mixer (e.g. in a Thinky™ mixer) for about 15-30 min at room temperature.

Example 2—Thermal Analysis of Inks

Thermogravimetric analyses of the inks were performed on a Netzsch TG 209 F1 under BOC HP argon (grade 5.3) gas and residual oxygen was trapped with a Supelco Big-Supelpure™ oxygen/watertrap.

Figure 2:
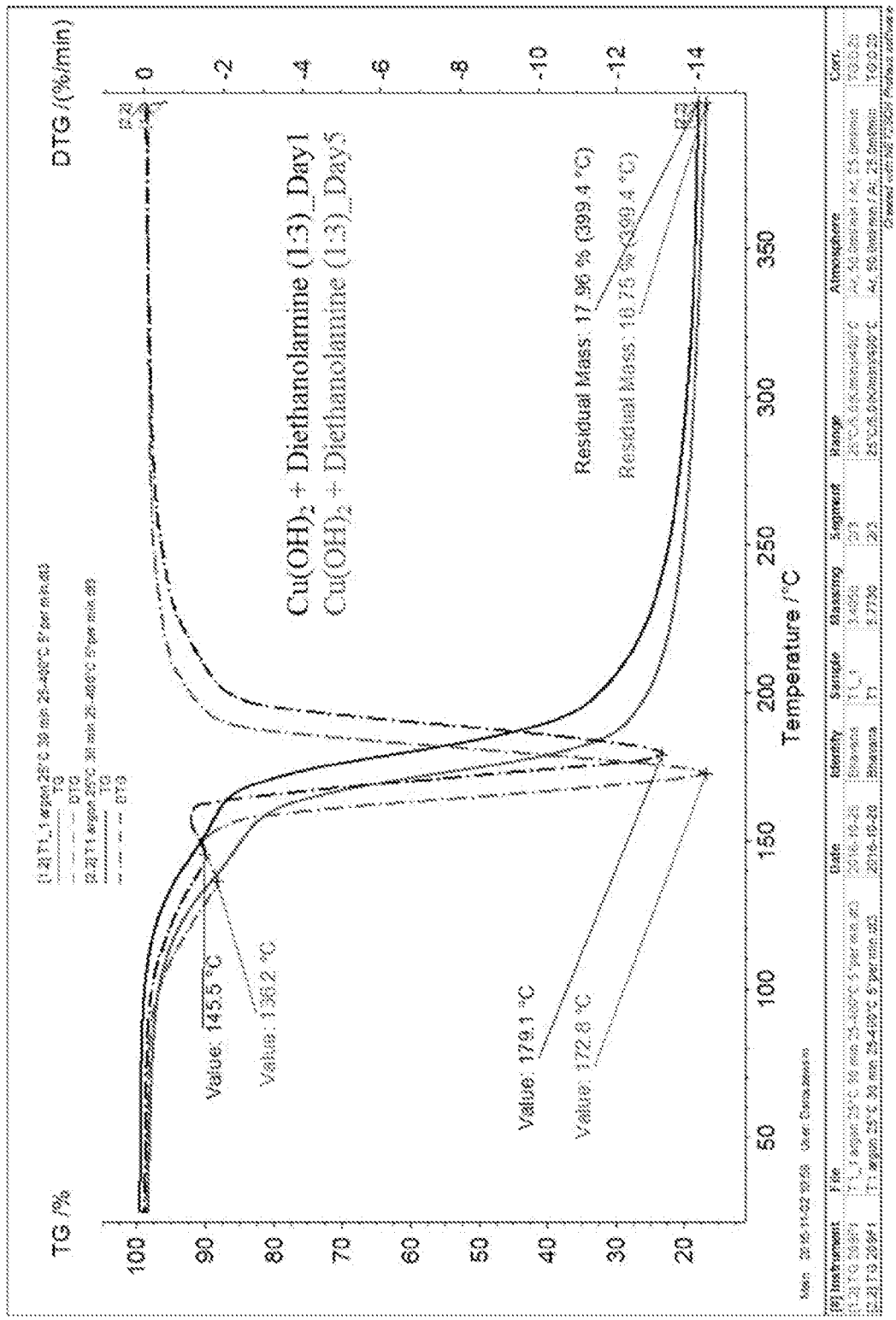
FIG. 2 depicts thermograms of an ink comprising copper hydroxide monohydrate ($Cu(OH)_2.H_2O$) and diethanolamine as a function of storage time.

Table 1 and FIG. 1 illustrate the results of thermogravimetric analyses under argon of various inks prepared as described in Example 1. All of the inks prepared comprise copper hydroxide monohydrate ($Cu(OH)_2.H_2O$) and diethanolamine ($HN(CH_2CH_2OH)_2$) in a 1:3 molar ratio of copper hydroxide to diethanolamine. An ink comprising ($Cu(OH)_2.H_2O$) and diethanolamine ($HN(CH_2CH_2OH)_2$) (I1) was analyzed along with inks comprising I1 and a fractional amount of other metal fillers (I2, I3, I4 and I5). The other metal fillers were copper nanoparticles (CuNP), silver nitrate ($AgNO_3$) or mixtures thereof. The ink compositions are provided below, where wt % is based on weight of Cu from $Cu(OH)_2.H_2O$:

FIG. 2 depicts the results of thermogravimetric analyses of the ink I1 under argon as a function of storage time. After 1 day of storage at room temperature, the ink I1 had a decomposition temperature of 179.1° C., while after 5 days of storage, I1 had a decomposition temperature of 172.8° C. Further, after 5 days of storage, thermal decomposition of I1 resulted in less residual mass (16.75%) at about 400° C. than thermal decomposition after 1 day (17.96%).

Example 3—Electrical Properties of Tape Cast Traces

Figure 3:
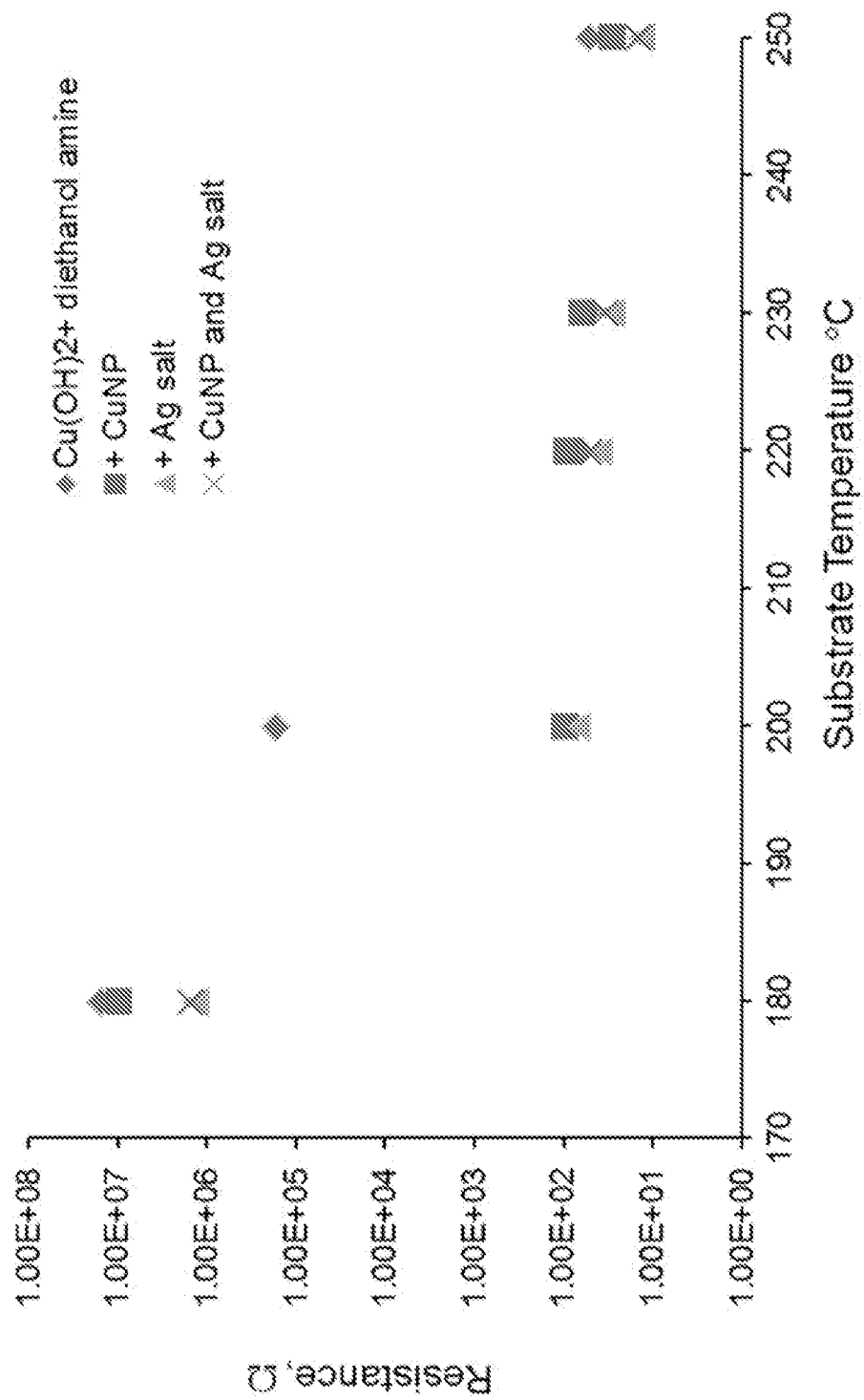
FIG. 3 depicts a graph of resistance ($\Omega$) vs. substrate temperature (° C.) for tape cast traces (5 μm thick, 10 cm long) on a Kapton™ substrate prepared from various inks comprising copper hydroxide monohydrate ($Cu(OH)_2.H_2O$) and diethanolamine thermally sintered at different temperatures under $N_2$ with 500 ppm $O_2$.

Tape cast traces (5 μm thick, 10 cm long) on a Kapton™ substrate were prepared from inks I1, I2, I3, I4 and I5 and thermally sintered at different temperatures under nitrogen ($N_2$) with 500 ppm oxygen ($O_2$). Resistances of the traces were measured, and Table 2 and FIG. 3 provide the results. It is evident that addition of one or both of CuNP and Ag salt lowers thermal sintering temperatures to obtain better conducting traces (i.e. traces with lower resistance). Resistance of about 100Ω or less are possible after sintering at a temperature of about 200° C. or higher.

TABLE 2

| Substrate Temp. (° C.) | Storage Time (Days) | Ink I1 | Ink I2 | Ink I3 | Ink I4 | Ink I5 |
| --- | --- | --- | --- | --- | --- | --- |
| 160° C. 1 h | 1 | — | — | — | — | — |
|  | 2 | — | — | 2.6 MΩ | — | — |
|  | 5 | — | 2.7 MΩ | 2.4 MΩ | — | — |
| 180° C. 1 h | 1 | 15 MΩ | 9.6 MΩ | 520 Ω | 13 MΩ | 5.7 MΩ |
|  | 2 | 1000 Ω | 103 Ω | 67 Ω | 530 Ω | 130 Ω |
|  | 5 | 163 Ω | 190 Ω | 100 Ω | 189 Ω | 135 Ω |
| 200° C. 1 h | 1 | 163 KΩ | 96 Ω | 65 Ω | 69 Ω | 93 Ω |
| 220° C. 1 h | 1 | 62 Ω | 92 Ω | 86 Ω | 40 Ω | 50 Ω |
| 230° C. 1 h | 1 | 52 Ω | 60 Ω | 95 Ω | 44 Ω | 34 Ω |
| 250° C. 1 h | 1 | 51 Ω | 63 Ω | 63 Ω | 27 Ω | 29 Ω |
| 110° C. 30 min | 1 | 80 Ω | 50 Ω | 24 Ω | 18 Ω | 17 Ω |
| 250° C. 10 min | 2 | 22 Ω | 29 Ω | 16 Ω | 13 Ω | 14 Ω |
|  | 5 | 105 Ω | 48 Ω | 19 Ω | 18 Ω | 13 Ω |

I1=$Cu(OH)_2.H_2O$+diethanolamine (1:3)
I2=I1+CuNP (10 wt %)
I3=I1+CuNP (20 wt %)
I4=I1+$AgNO_3$ (10 wt %)
I5=I1+CuNP (10 wt %)+$AgNO_3$ (10 wt %)

Table 1 indicates the thermal decomposition temperature for each ink, the amount of residue left over at 400° C. after thermal decomposition (% based on total weight of the ink), the amount of metal in the ink (wt % of Cu or Cu/Ag based on total weight of the ink), and whether the ink can be sintered by thermal and photo methods (Y=yes, N=no).

TABLE 1

| Ink | Decomposition Temp. (° C.) | Residue (%) at 400° C. | wt % metal in the ink | Sintering Thermal/Photo |
| --- | --- | --- | --- | --- |
| I1 | 179.6 | 17.96 | 15.06 | Y/Y |
| I2 | 176.9 | 17.98 | 16.56 | Y/Y |
| I3 | 173.4 | 18.07 | 18.06 | Y/Y |
| I4 | 170.4 | 16.77 | 16.56 | Y/Y |
| I5 | 173.4 | 18.17 | 18.06 | Y/Y |

The results indicate that all of the inks based on copper hydroxide and diethanolamine could be thermally and photo-sintered. Further, the decomposition of I1 is at about 180° C., and further decreases in the decomposition temperature can be attained by adding fractional amounts of CuNP and/or silver (Ag) salt.

Figure 4:
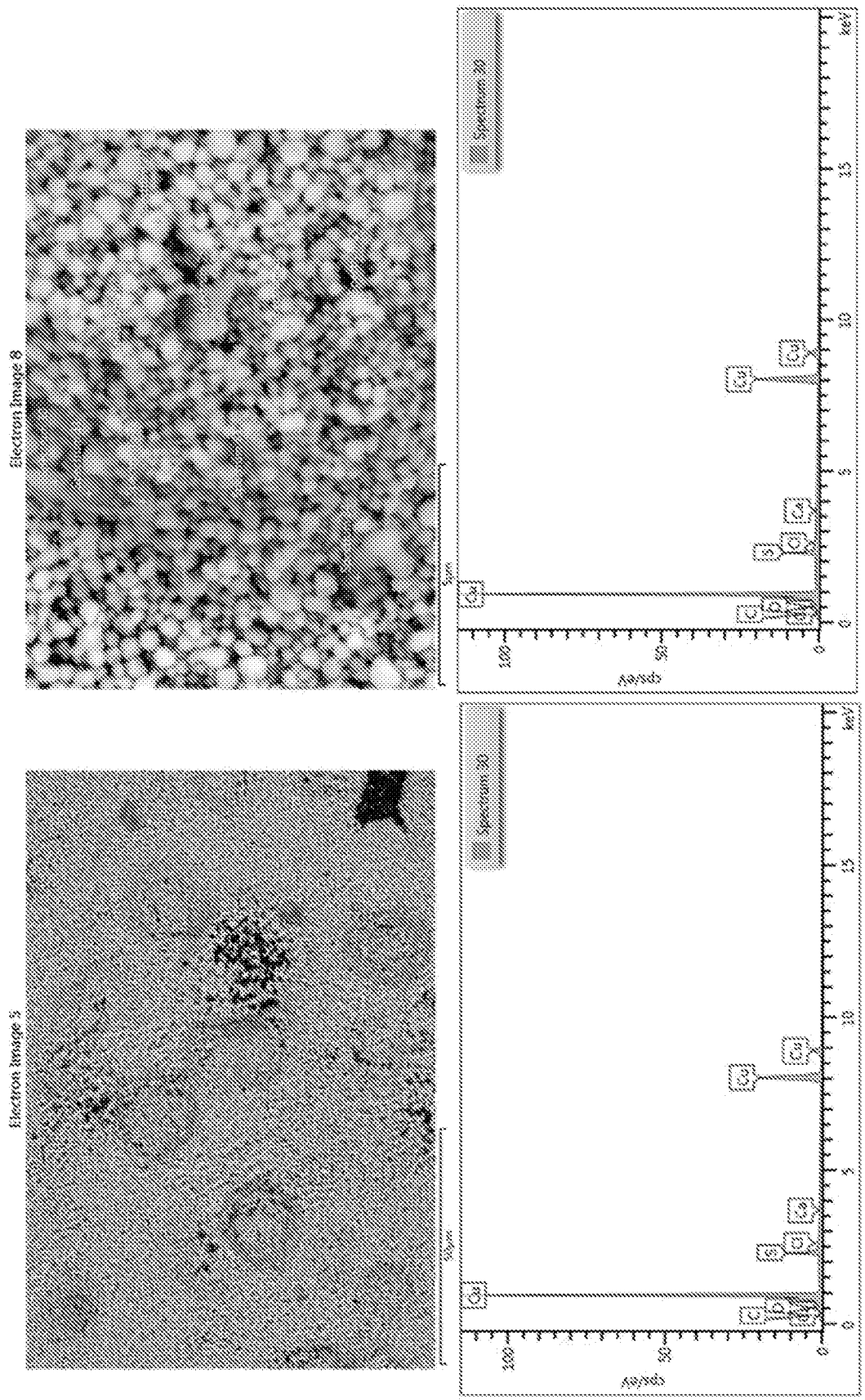
FIG. 4 depicts scanning electron microscopy (SEM) (top) and energy dispersive spectroscopy (EDS) (bottom) analyses of a copper film (5 μm thick, 1 $cm^2$ area) on a Kapton™ substrate prepared using a copper ink comprising $Cu(OH)_2.H_2O$ and diethanolamine (1:3).

Example 4—Morphological Characterization and Energy Dispersive Spectroscopy (EDS) of Tape Cast Traces FIG. 4 depicts scanning electron microscopy (SEM) (top) and energy dispersive spectroscopy (EDS) (bottom) analyses of a copper film (5 μm thick, 1 cm² area) on a Kapton™ substrate prepared using ink I1. The SEM images illustrate that the films have a porous morphology and the EDS illustrates that the film is formed of pure copper.

Figure 5:
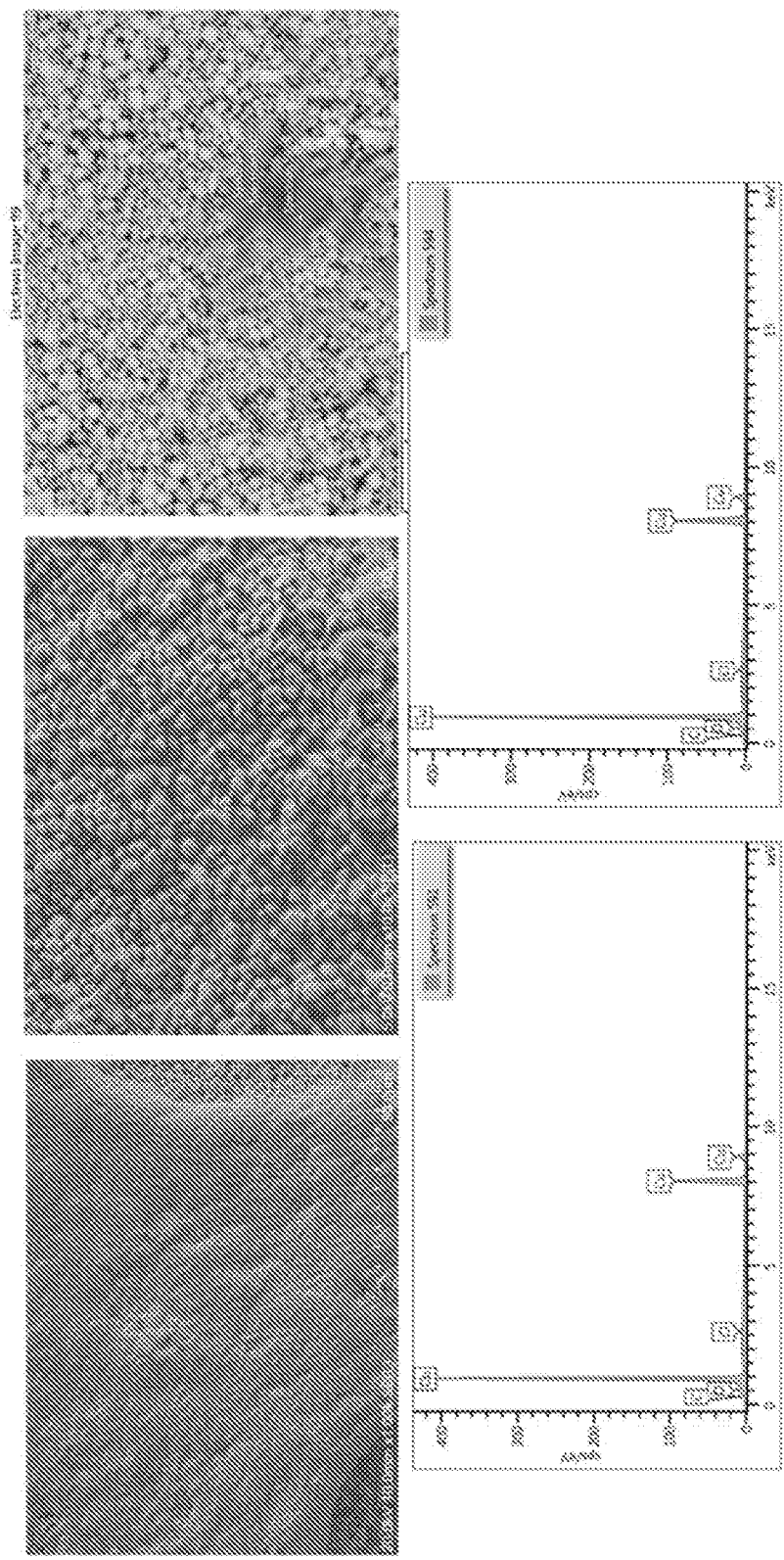
FIG. 5 depicts scanning electron microscopy (SEM) (top) and energy dispersive spectroscopy (EDS) (bottom) analyses of a copper film (5 μm thick, 1 $cm^2$ area) prepared on a Kapton™ substrate using a copper ink comprising $Cu(OH)_2.H_2O$ and diethanolamine (1:3) and copper nanoparticles (10 wt % of the Cu from $Cu(OH)_2.H_2$).

FIG. 5 depicts scanning electron microscopy (SEM) (top) and energy dispersive spectroscopy (EDS) (bottom) analyses of a copper film (5 μm thick, 1 cm² area) prepared on a Kapton™ substrate using ink I2. The SEM and EDS illustrate that addition of copper nanoparticles results in a film that is non-porous and dense, and made of pure copper.

Figure 6:
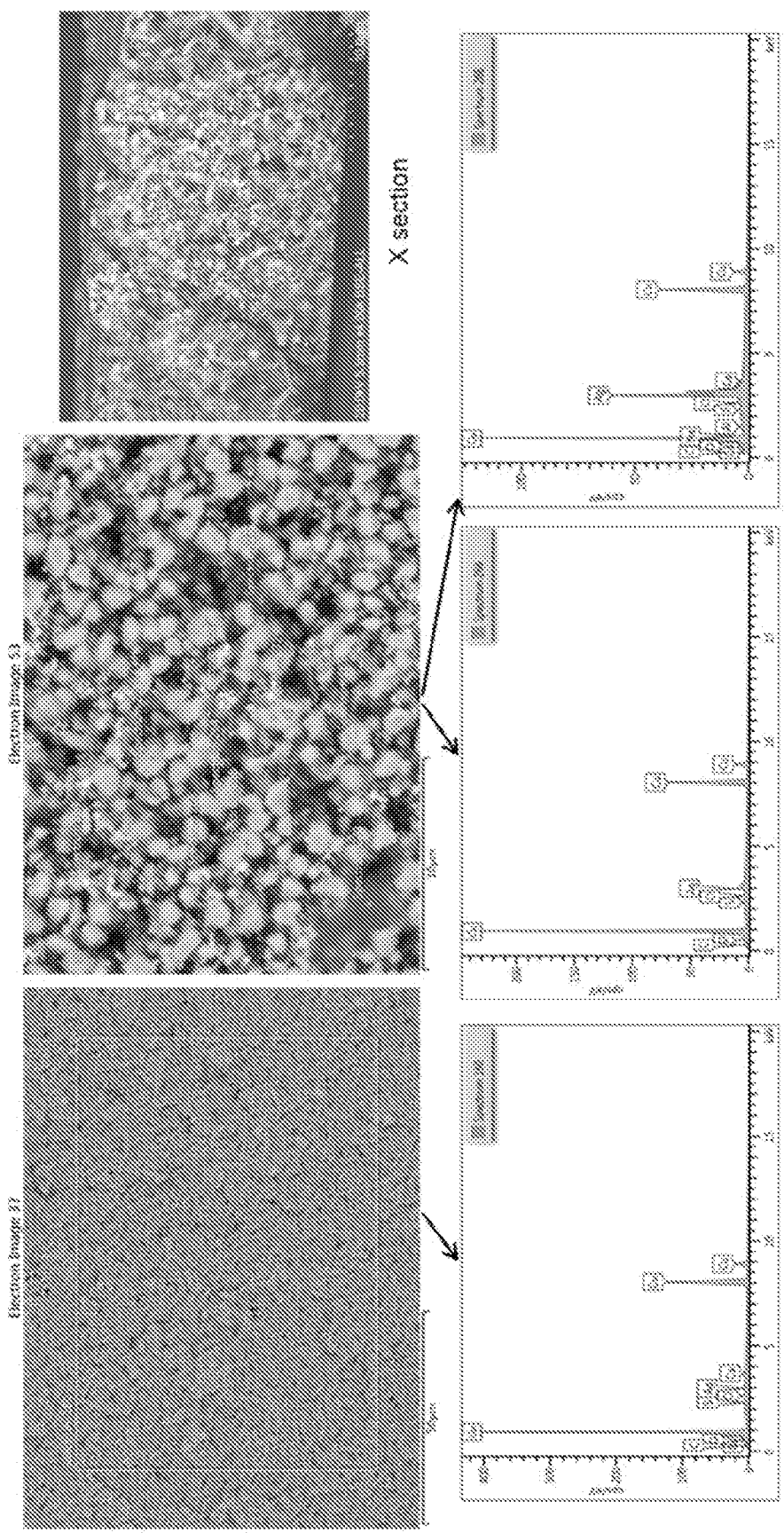
FIG. 6 depicts scanning electron microscopy (SEM) (top) and energy dispersive spectroscopy (EDS) (bottom) analyses of a copper film (5 μm thick, 1 $cm^2$ area) on a Kapton™ substrate prepared using a copper ink comprising $Cu(OH)_2.H_2O$ and diethanolamine (1:3) and silver nitrate (10 wt % of the Cu from $Cu(OH)_2.H_2O$).

FIG. 6 depicts scanning electron microscopy (SEM) (top) and energy dispersive spectroscopy (EDS) (bottom) analyses of a copper film (5 μm thick, 1 cm² area) on a Kapton™ substrate prepared using ink I4. The SEM and EDS illustrate that addition of a fractional amount of Ag salt forms silver nanoparticles (bright spots), which act as interconnects forming a pure copper/Ag composite film.

Figure 7:
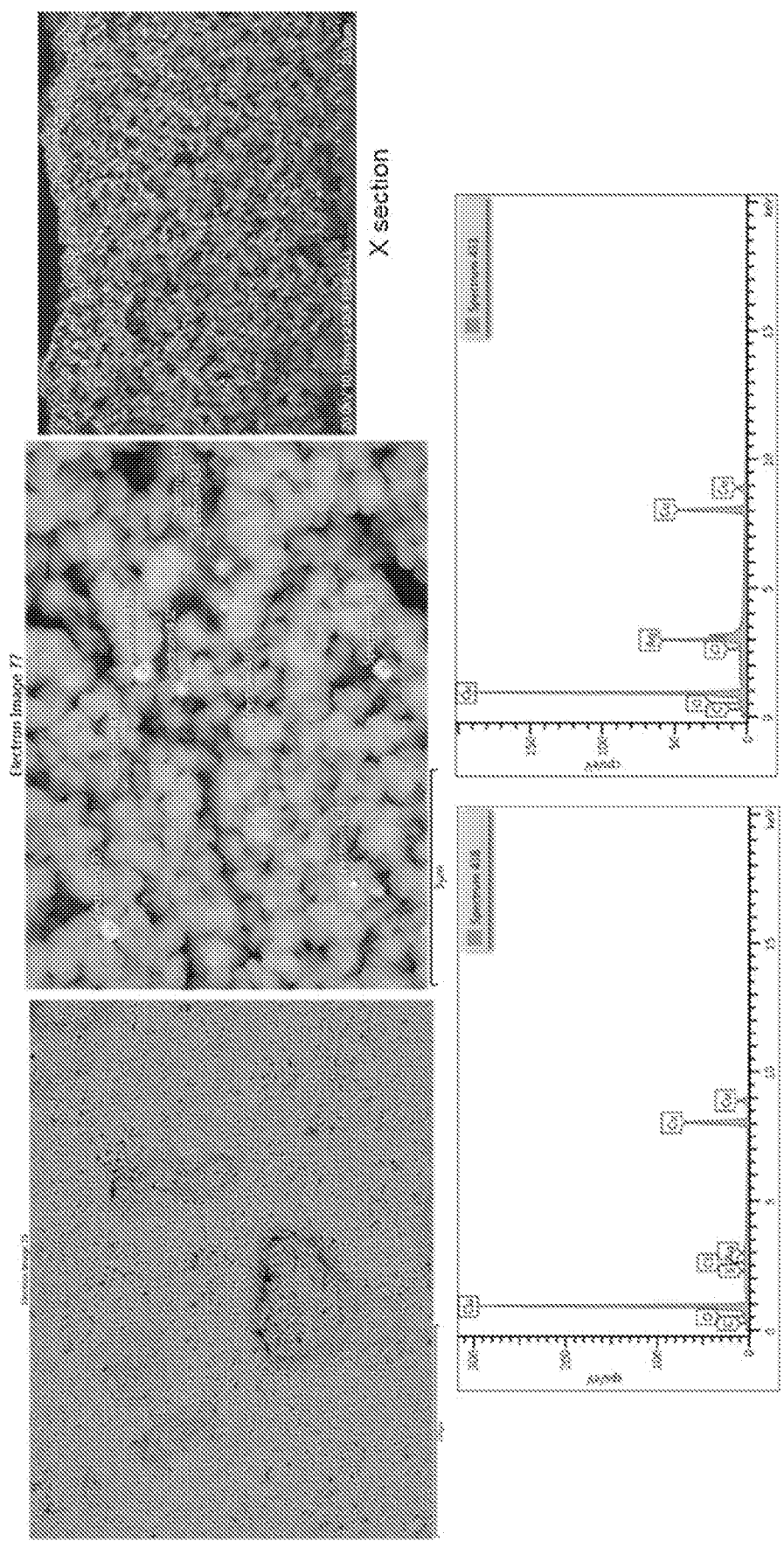
FIG. 7 depicts scanning electron microscopy (SEM) (top) and energy dispersive spectroscopy (EDS) (bottom) analyses of a copper film (5 μm thick, 1 $cm^2$ area) on a Kapton™ substrate prepared using a copper ink comprising $Cu(OH)_2.H_2O$ and diethanolamine (1:3) and copper nanoparticles (10 wt % of the Cu from $Cu(OH)_2.H_2O$) and silver nitrate (10 wt % of the Cu from $Cu(OH)_2.H_2O$).

FIG. 7 depicts scanning electron microscopy (SEM) (top) and energy dispersive spectroscopy (EDS) (bottom) analyses of a copper film (5 μm thick, 1 cm² area) on a Kapton™ substrate prepared using ink I5. The SEM and EDS illustrate that addition of CuNP forms a dense film, and the addition of a fractional amount of Ag salt forms silver-Cu composite nanoparticles (bright spots), which act as interconnects forming a pure copper/Ag composite film.

Example 5—Sintering of Screen Printed Cu Traces

Inks I6 to I14 were formulated as described in Example 1 comprising $Cu(OH)_2 \cdot H_2O$ and diethanolamine (1:3) together with other components as listed in Table 3.

TABLE 3

| Ink | Binder | Filler |
|---|---|---|
| I6 | None | None |
| I7 | None | CuNP (10 wt %)[1] |
| I8 | Rokrapol ™ 7075 (0.5 wt %)[1] | CuNP (10 wt %)[1] |
| I9 | None | $AgNO_3$ (10 wt %)[1] |
| I10 | Rokrapol ™ 7075 (0.5 wt %)[1] | $AgNO_3$ (10 wt %)[1] |
| I11 | Rokrapol ™ 7075 (0.5 wt %)[1] | $AgNO_3$ (7.5 wt %)[1] |
| I12 | Rokrapol ™ 7075 (0.5 wt %)[1] | $AgNO_3$ (5 wt %)[1] |
| I13 | Rokrapol ™ 7075 (0.5 wt %)[1] | None |
| I14 | None | CuNP (10 wt %)[1] and $AgNO_3$ (10 wt %)[1] |

[1]based on weight of the Cu from $Cu(OH)_2 \cdot H_2O$

Each of the inks was screen printed on a substrate to form traces and then sintered. The inks were screen printed onto 8.5 in.×11 in. sheets of Kapton™ and or Melinex™ film using a flatbed ATMA screen printer or an American M&M S-912M small format screen printer through patterns photoimaged onto kiwocol emulsion (10-14 μm) supported on a SS403 stainless steel mesh (Dynamesh, IL). For thermally processed samples, the printed traces were sintered at 110° C. for 30 min and then 250° C. (substrate temperature) for 15 min to convert the Cu hydroxide/diethanolamine MOD ink into metallic copper. For the samples processed via photonic sintering, the printed traces were dried at 140° C. for 15-45 min to remove the solvent and subsequently processed under ambient conditions using a PulseForge™1300 Novacentrics photonic curing system.

Example 5-1—Inks Containing No Binder or Filler (I6)

Ink I6 was screen printed on a Kapton™ substrate, dried in a reflow oven at 140° C. for 15 min, and photo-sintered by PulseForge™ sintering at 290V/3000 μs/1 μs/3 overlap to form sintered copper traces on the substrate. Table 4 provides physical and electrical properties of the copper traces and Table 5 provides mechanical properties (flexibility as per ASTM F1683-02 flex & crease test). As illustrated in Table 4 and Table 5, ink I6 having no binder or filler provides photo-sintered conducting copper traces with reasonable flex properties. Thermal sintering of ink I6 was found to produce sintered copper traces that were not conductive.

TABLE 4

| Nominal linewidth (mil) | Ω | Linewidth (mil) | Linewidth (μm) | # of □ | Ω/□ | mΩ/□ |
|---|---|---|---|---|---|---|
| 5 | 518 | 5.24 | 133 | 752 | 0.69 | 689 |
| 10 | 149 | 10.49 | 266 | 375 | 0.40 | 397 |
| 15 | 95 | 15.28 | 388 | 258 | 0.37 | 369 |
| 20 | 66 | 20.57 | 522 | 191 | 0.34 | 345 |

TABLE 5

| | | Nominal line widths | | | |
|---|---|---|---|---|---|
| | | 5 mil | 10 mil | 15 mil | 20 mil |
| Tensile flex | % change in R | 4.4 ± 0.6 | 3.4 ± 0.9 | 2.9 ± 0.9 | 3.2 ± 0.7 |
| | open fails | 0/5 | 0/5 | 0/5 | 0/5 |
| Compressive flex | % change in R | 20.6 ± 1.7 | 17.6 ± 0.6 | 16.8 ± 5.9 | 18.7 ± 1.9 |
| | open fails | 0/5 | 0/5 | 0/5 | 0/5 |
| Tensile crease | % change in R | 7 ± 2 | 3.7 ± 2.4 | 4.4 ± 2.9 | 3.3 ± 1.4 |
| | open fails | 0/5 | 0/5 | 0/5 | 0/5 |
| Compressive crease | % change in R | 5.8 ± 1.8 | 5 ± 0.9 | 5.4 ± 0.6 | 4.7 ± 0.6 |
| | open fails | 3/5 | 0/5 | 0/5 | 0/5 |

Example 5-2—Inks Containing CuNP Filler but No Binder (I7)

Ink I7 was screen printed on a Kapton™ substrate and thermally sintered first at 110° C. for 30 min and then at 250° C. for 15 min under an atmosphere of $N_2$ with 500 ppm oxygen. Table 6 and Table 7 provide physical and electrical properties of the copper traces produced. As illustrated in Table 6 and Table 7, addition of CuNP to the ink enabled the production of screen printed thermally sintered conducting copper traces.

TABLE 6

| Nominal linewidth (mil) | Ω | Linewidth (mil) | Linewidth (μm) | # of □ | Ω/□ | mΩ/□ |
|---|---|---|---|---|---|---|
| 10 | 64 | 12.64 | 321 | 312 | 0.21 | 205 |
| 15 | 16 | 22.44 | 570 | 175 | 0.09 | 91 |
| 20 | 9 | 27.56 | 700 | 143 | 0.06 | 63 |

TABLE 7

| Nominal linewidth (mil) | Line thickness (μm) | Thickness (mil) | Sheet resistivity (mΩ/□/mil) | Volume resistivity (μΩ · cm) |
|---|---|---|---|---|
| 10 | 1.80 | 0.071 | 14.56 | 36.97 |
| 15 | 3.00 | 0.12 | 10.77 | 27.36 |
| 20 | 4.00 | 0.16 | 9.92 | 25.20 |

Ink I7 was screen printed on a Kapton™ substrate, dried in a reflow oven at 140° C. for 45 min, and photo-sintered by PulseForge™ sintering at 290V/3000 μs/1 μs/3 overlap to form sintered copper traces on the substrate. Table 8 provides physical and electrical properties of the copper traces, and Table 9 provides mechanical properties (flexibility as per ASTM F1683-02 flex & crease test). As illustrated by comparing Table 8 to Table 4, the addition of CuNP to the ink further increases conductivity of photo-sintered copper traces. As illustrated in Table 9, photo-sintered copper traces produced from the ink I7 passed all mechanical tests. There were no open fails in any of the tests.

TABLE 8

| Nominal linewidth (mil) | Ω | Linewidth (mil) | Linewidth (μm) | # of □ | Ω/□ | mΩ/□ |
|---|---|---|---|---|---|---|
| 5 | 215 | 5.45 | 138.50 | 722 | 0.30 | 298 |
| 10 | 101 | 10.47 | 266.00 | 376 | 0.27 | 269 |
| 15 | 75 | 15.31 | 389.00 | 257 | 0.29 | 292 |
| 20 | 48 | 20.41 | 518.50 | 193 | 0.25 | 249 |

TABLE 9

| | | Nominal line widths | | | |
|---|---|---|---|---|---|
| | | 5 mil | 10 mil | 15 mil | 20 mil |
| Tensile flex | % change in R | 5.1 ± 0.7 | 5.2 ± 0.3 | 4.9 ± 0.4 | 3.9 ± 0.3 |
| | open fails | 0/5 | 0/5 | 0/5 | 0/5 |
| Compressive flex | % change in R | 17.6 ± 1.4 | 18 ± 1.6 | 18.8 ± 1.4 | 18.6 ± 1.6 |
| | open fails | 0/5 | 0/5 | 0/5 | 0/5 |
| Tensile crease | % change in R | 3.2 ± 1.1 | 2.7 ± 0.3 | 2.8 ± 0.8 | 2.4 ± 1.1 |
| | open fails | 0/5 | 0/5 | 0/5 | 0/5 |
| Compressive crease | % change in R | 4.8 ± 0.2 | 5.2 ± 0.6 | 5.3 ± 0.6 | 5.1 ± 0.6 |
| | open fails | 0/5 | 0/5 | 0/5 | 0/5 |

Example 5-3—Inks Containing Binder and CuNP Filler (I8)

Ink I8 was screen printed on a Kapton™ substrate, dried in are flow oven at 140° C. for 45 min, and photo-sintered by PulseForge™ sintering at 290V/3000 μs/1 ρs/3 overlap to form sintered copper traces on the substrate. Table 10 provides physical and electrical properties of the copper traces, and Table 11 provides mechanical properties (flexibility as per ASTM F1683-02 flex & crease test). As illustrated in Table 10, the addition of a binder to the ink still results in sintered copper traces having good conductivity. As illustrated in Table 11, photo-sintered copper traces produced from the ink I8 passed all mechanical tests. There were no open fails in any of the tests.

TABLE 10

| Nominal linewidth (mil) | Ω | Linewidth (mil) | Linewidth (μm) | # of □ | Ω/□ | mΩ/□ |
|---|---|---|---|---|---|---|
| 5 | 350 | 5.75 | 146 | 685 | 0.51 | 511 |
| 10 | 155 | 10.59 | 269 | 372 | 0.42 | 417 |
| 15 | 95 | 15.55 | 395 | 253 | 0.38 | 375 |
| 20 | 66 | 20.47 | 520 | 192 | 0.34 | 343 |

TABLE 11

| | | Nominal line widths | | | |
|---|---|---|---|---|---|
| | | 5 mil | 10 mil | 15 mil | 20 mil |
| Tensile flex | % change in R | 4.8 ± 0.8 | 4.9 ± 0.9 | 4.9 ± 0.9 | 5 ± 1.4 |
| | open fails | 0/4 | 0/4 | 0/4 | 0/4 |
| Compressive flex | % change in R | 14.4 ± 1.3 | 15 ± 1.2 | 15.6 ± 1 | 15.8 ± 1.1 |
| | open fails | 0/4 | 0/4 | 0/4 | 0/4 |

TABLE 11-continued

| | | Nominal line widths | | | |
|---|---|---|---|---|---|
| | | 5 mil | 10 mil | 15 mil | 20 mil |
| Tensile crease | % change in R | 3.7 ± 0.8 | 4.1 ± 0.3 | 4.5 ± 0.7 | 5.8 ± 1.7 |
| | open fails | 0/4 | 0/4 | 0/4 | 0/4 |
| Compressive crease | % change in R | 5.1 ± 0.7 | 5.1 ± 0.7 | 5.2 ± 0.7 | 5.4 ± 0.6 |
| | open fails | 0/4 | 0/4 | 0/4 | 0/4 |

Ink I8 was screen printed on Melinex™ substrate, dried in reflow oven at 140° C. for 60 min, and photo-sintered by PulseForge™ sintering at 230V/6000 µs/1 µs/3 overlap to form sintered copper traces on the substrate. Table 12 provides physical and electrical properties of the copper traces. As illustrated in Table 12, conductive copper traces may be formed on a low temperature substrate such as Melinex™ by photo-sintering screen-printed traces of the ink.

TABLE 12

| Nominal linewidth (mil) | Ω | Linewidth (mil) | Linewidth (µm) | # of □ | Ω/□ | mΩ/□ |
|---|---|---|---|---|---|---|
| 15 | 103 | 15.20 | 386 | 259 | 0.40 | 398 |
| 20 | 79 | 20.16 | 512 | 195 | 0.40 | 404 |

To illustrate the effect of drying time on conductivity of photo-sintered copper traces, ink I8 was screen printed on a Kapton™ substrate, dried in are flow oven at 140° C. for different periods of time (10-45 min), and photo-sintered by PulseForge™ sintering at 290V/3000 µs/1 µs/3 overlap to form sintered copper traces on the substrate. Table 13 provides the resistance (Ω) of lines dried for various lengths of time. As illustrated in Table 13, longer drying times tend to increase conductivity of the photo-sintered copper traces with excellent resolution.

TABLE 13

| Nominal linewidth (mil) | 10 min | 15 min | 20 min | 30 min | 45 min |
|---|---|---|---|---|---|
| 5 | — | — | 566 Ω | 449 Ω | 350 Ω |
| 10 | 715 Ω | 201 Ω | 214 Ω | 154 Ω | 155 Ω |
| 15 | 441 Ω | 104 Ω | 116 Ω | 92 Ω | 95 Ω |
| 20 | 354 Ω | 76 Ω | 79 Ω | 76 Ω | 66 Ω |

Example 5-4—Inks Containing No Binder and AgNO₃ Filler (I9)

Ink I9 was screen printed on a Kapton™ substrate and thermally sintered first at 110° C. for 30 min and then at 250° C. for 15 min under an atmosphere of N₂ with 500 ppm oxygen. Table 14 and Table 15 provide physical and electrical properties of the copper-silver composite traces produced, and Table 16 provides mechanical properties (flexibility as per ASTM F1683-02 flex & crease test). As illustrated in Table 14, Table 15 and Table 16, the addition of silver salt to the ink enabled the production of screen printed thermally sintered conducting copper-silver composite traces without the presence of binder in the ink, which passed all mechanical tests without open fails.

TABLE 14

| Nominal linewidth (mil) | Ω | Linewidth (mil) | Linewidth (µm) | # of □ | Ω/□ | mΩ/□ |
|---|---|---|---|---|---|---|
| 5 | 536 | 5.31 | 135.00 | 741 | 0.72 | 724 |
| 10 | 130 | 10.16 | 258.00 | 388 | 0.34 | 335 |
| 15 | 68 | 15.00 | 381.00 | 262 | 0.26 | 259 |
| 20 | 47 | 19.29 | 490.00 | 204 | 0.23 | 230 |

TABLE 15

| Nominal linewidth (mil) | Line thickness (µm) | Thickness (mil) | Sheet resistivity (mΩ/□/mil) | Volume resistivity (µΩ · cm) |
|---|---|---|---|---|
| 5 | 0.50 | 0.020 | 14.24 | 36.18 |
| 10 | 0.70 | 0.028 | 9.24 | 23.47 |
| 15 | 0.80 | 0.031 | 8.16 | 20.72 |
| 20 | 0.90 | 0.035 | 8.16 | 20.72 |

TABLE 16

| | | Nominal line widths | | | |
|---|---|---|---|---|---|
| | | 5 mil | 10 mil | 15 mil | 20 mil |
| Tensile flex | % change in R | 0.7 | 0.3 | 0.5 | 0.4 |
| | open fails | 0/3 | 0/3 | 0/3 | 0/3 |
| Compressive flex | % change in R | 8.0 | 8.6 | 7.8 | 6.9 |
| | open fails | 0/3 | 0/3 | 0/3 | 0/3 |
| Tensile crease | % change in R | 11.3 | 10.6 | 16 | 18 |
| | open fails | 0/3 | 0/3 | 0/3 | 0/3 |
| Compressive crease | % change in R | 5.36 | 10.6 | 5.5 | 6.3 |
| | open fails | 0/3 | 0/3 | 0/3 | 0/3 |

Ink I9 was screen printed on a Kapton™ substrate, dried in a reflow oven at 140° C. for 15 min, and photo-sintered by PulseForge™ sintering at 300V/3000 µs/1 µs/3 overlap to form sintered copper-silver composite traces on the substrate. Table 17 provides physical and electrical properties of the copper-silver composite traces, and Table 18 provides mechanical properties (flexibility as per ASTM F1683-02 flex & crease test). As illustrated by comparing Table 17 to Table 4, the addition of silver salt to the ink further increases conductivity of photo-sintered traces. As illustrated in Table 18, photo-sintered copper-silver composite traces produced from the ink I9 passed all mechanical tests. Open fails only occurred at very narrow line widths.

TABLE 17

| Nominal linewidth (mil) | Ω | Linewidth (mil) | Linewidth (µm) | # of □ | Ω/□ | mΩ/□ |
|---|---|---|---|---|---|---|
| 3 | 692 | 3.35 | 85 | 1176 | 0.59 | 588 |
| 5 | 207 | 5.55 | 141 | 709 | 0.29 | 292 |
| 10 | 67 | 10.43 | 265 | 377 | 0.18 | 178 |

TABLE 17-continued

| Nominal linewidth (mil) | Ω | Linewidth (mil) | Linewidth (μm) | # of □ | Ω/□ | mΩ/□ |
|---|---|---|---|---|---|---|
| 15 | 41 | 15.35 | 390 | 256 | 0.16 | 160 |
| 20 | 29 | 20.47 | 520 | 192 | 0.15 | 151 |

TABLE 18

| | | Nominal line widths | | | | |
|---|---|---|---|---|---|---|
| | | 3 mil | 5 mil | 10 mil | 15 mil | 20 mil |
| Tensile flex | % change in R | 5.1 ± 0.8 | 4.1 ± 0.6 | 3.1 ± 0.9 | 2.9 ± 1.3 | 2.8 ± 1 |
| | open fails | 0/4 | 0/5 | 0/5 | 0/5 | 0/5 |
| Compressive flex | % change in R | 10.7 ± 1.2 | 11.3 ± 0.9 | 11.7 ± 0.8 | 11.3 ± 1.8 | 12 ± 1.2 |
| | open fails | 0/4 | 0/5 | 0/5 | 0/5 | 0/5 |
| Tensile crease | % change in R | 2 ± 0.9 | 3.2 ± 0.5 | 4.4 ± 2.1 | 4.1 ± 1.8 | 3.2 ± 1.1 |
| | open fails | 2/4 | 0/5 | 0/5 | 0/5 | 0/5 |
| Compressive crease | % change in R | 2.3 ± 0.7 | 3.5 ± 0.3 | 3.6 ± 0.6 | 3.6 ± 0.6 | 4 ± 0.7 |
| | open fails | 2/4 | 0/5 | 0/5 | 0/5 | 0/5 |

Example 5-5—Inks Containing Binder and AgNO₃ Filler (I0)

Ink I10 was screen printed on a Kapton™ substrate, dried in are flow oven at 140° C. for 15 min, and photo-sintered by PulseForge™ sintering at 300V/3000 μs/1 μs/3 overlap to form sintered copper-silver composite traces on the substrate. Table 19 provides physical and electrical properties of the copper-silver composite traces, and Table 20 provides mechanical properties (flexibility as per ASTM F1683-02 flex & crease test). As illustrated in Table 19, the addition of a binder to the ink still results in sintered copper-silver composite traces having good conductivity. As illustrated in Table 20, photo-sintered copper-silver composite traces produced from the ink I10 passed all mechanical tests with a change in R of less than 10% in all cases and without open fails.

TABLE 19

| Nominal linewidth (mil) | Ω | Linewidth (mil) | Linewidth (μm) | # of □ | Ω/□ | mΩ/□ |
|---|---|---|---|---|---|---|
| 5 | 286 | 5.43 | 138 | 725 | 0.39 | 395 |
| 10 | 84 | 10.73 | 272 | 367 | 0.23 | 229 |
| 15 | 49 | 15.26 | 387 | 258 | 0.19 | 190 |
| 20 | 36 | 19.88 | 505 | 198 | 0.18 | 182 |

TABLE 20

| | | Nominal line widths | | | |
|---|---|---|---|---|---|
| | | 5 mil | 10 mil | 15 mil | 20 mil |
| Tensile flex | % change in R | 1.5 ± 0.3 | 1.7 ± 0.4 | 1.7 ± 0.6 | 1.8 ± 1.2 |
| | open fails | 0/5 | 0/5 | 0/5 | 0/5 |
| Compressive flex | % change in R | 5.1 ± 1 | 5.1 ± 1 | 5.4 ± 1 | 5.5 ± 1 |
| | open fails | 0/5 | 0/5 | 0/5 | 0/5 |
| Tensile crease | % change in R | 1.7 ± 0.3 | 1.8 ± 0.7 | 1.9 ± 0.3 | 1.9 ± 0.4 |
| | open fails | 0/5 | 0/5 | 0/5 | 0/5 |
| Compressive crease | % change in R | 1.7 ± 0.4 | 1.1 ± 1.8 | 1 ± 0.8 | 1.7 ± 0.7 |
| | open fails | 0/5 | 0/5 | 0/5 | 0/5 |

Ink I10 was screen printed on a Melinex™ substrate, dried in a reflow oven at 140° C. for 60 min, and photo-sintered by PulseForge™ sintering at 300V/1500 μs/1 μs/3 overlap 2× to form sintered copper-silver composite traces on the substrate. Table 21 provides physical and electrical properties of the copper-silver composite traces. As illustrated in Table 21, conductive copper-silver composite traces may be formed on a low temperature substrate such as Melinex™ by photo-sintering screen-printed traces of the ink.

TABLE 21

| Nominal linewidth (mil) | Ω | Linewidth (mil) | Linewidth (μm) | # of □ | Ω/□ | mΩ/□ |
|---|---|---|---|---|---|---|
| 15 | 316 | 10.35 | 263 | 380 | 0.83 | 831 |
| 20 | 230 | 12.68 | 322 | 311 | 0.74 | 741 |

To illustrate the effect of drying time on conductivity of photo-sintered copper-silver composite traces, ink I10 was screen printed on a Kapton™ substrate, dried in a reflow oven at 140° C. for different periods of time (10-60 min), and photo-sintered by PulseForge™ sintering at 300V/3000 μs/1 μs/3 overlap to form sintered copper-silver composite traces on the substrate. Table 22 provides the resistance (Ω) of lines dried for various lengths of time. As illustrated in Table 22, drying times from about 15 minutes to 20 minutes tend to increase conductivity of the photo-sintered copper-silver composite traces with excellent resolution.

TABLE 22

| Nominal linewidth (mil) | 10 min | 15 min | 20 min | 30 min | 60 min |
|---|---|---|---|---|---|
| 5 | 536 Ω | 286 Ω | 325 Ω | 419 Ω | 1300 Ω |
| 10 | 132 Ω | 84 Ω | 89 Ω | 122 Ω | 188 Ω |
| 15 | 77 Ω | 49 Ω | 49 Ω | 70 Ω | 110 Ω |
| 20 | 58 Ω | 36 Ω | 36 Ω | 49 Ω | 86 Ω |

To illustrate the effect of the amount of $AgNO_3$ filler on conductivity of photo-sintered copper-silver composite traces, inks I10, I11, I12 and I13 were screen printed on a Kapton™ substrate, dried at 140° C. for 15 min), and photo-sintered by PulseForge™ sintering at 300V/3000 μs/1 μs/3 overlap to form sintered copper-silver composite traces on the substrate. Table 23 provides resistances (Ω) of the copper-silver composite traces. As illustrated in Table 23, there is a systematic increase in the conductivity of copper-silver composite traces with the addition of silver salt.

TABLE 23

| Nominal linewidth (mil) | Ink I13 (0% $AgNO_3$) | Ink I12 (5% $AgNO_3$) | Ink I11 (7.5% $AgNO_3$) | Ink I10 (10% $AgNO_3$) |
|---|---|---|---|---|
| 5 | 844 Ω | 319 Ω | 298 Ω | 286 Ω |
| 10 | 255 Ω | 124 Ω | 101 Ω | 84 Ω |
| 15 | 137 Ω | 66 Ω | 54 Ω | 49 Ω |
| 20 | 87 Ω | 50 Ω | 39 Ω | 36 Ω |

Example 5-6—Inks Containing Binder, CuNP Filler and $AgNO_3$ Filler (I14)

Ink I14 was screen printed on a Kapton™ substrate and thermally sintered first at 110° C. for 30 min and then at 250° C. for 15 min under an atmosphere of $N_2$ with 500 ppm oxygen. Table 24 and Table 25 provide physical and electrical properties of the copper-silver composite traces produced, and Table 26 provides mechanical properties (flexibility as per ASTM F1683-02 flex & crease test). As illustrated in Table 24, Table 25 and Table 26, the addition of both copper nanoparticles and silver salt to the ink enabled the production of screen printed thermally sintered conducting copper-silver composite traces without the presence of binder in the ink, which passed all mechanical tests without open fails.

TABLE 24

| Nominal linewidth (mil) | Ω | Linewidth (mil) | Linewidth (μm) | # of □ | Ω/□ | mΩ/□ |
|---|---|---|---|---|---|---|
| 5 | 600 | 6.30 | 160.00 | 625 | 0.96 | 960 |
| 10 | 191 | 12.60 | 320.00 | 313 | 0.61 | 611 |
| 15 | 107 | 16.65 | 423.00 | 236 | 0.45 | 453 |
| 20 | 77 | 22.05 | 560.00 | 179 | 0.43 | 431 |

TABLE 25

| Nominal linewidth (mil) | Line thickness (μm) | Thickness (mil) | Sheet resistivity (mΩ/□/mil) | Volume resistivity (μΩ · cm) |
|---|---|---|---|---|
| 5 | 0.45 | 0.018 | 17.01 | 43.20 |
| 10 | 0.70 | 0.028 | 16.84 | 42.78 |
| 15 | 0.80 | 0.031 | 14.26 | 36.20 |
| 20 | 0.90 | 0.035 | 15.28 | 38.80 |

TABLE 26

| | | Nominal line widths | | | |
|---|---|---|---|---|---|
| | | 5 mil | 10 mil | 15 mil | 20 mil |
| Tensile flex | % change in R | 0.70 | 0.92 | 0.47 | 0.60 |
| | open fails | 0/3 | 0/3 | 0/3 | 0/3 |
| Compressive flex | % change in R | 10.5 | 9.7 | 9.1 | 5.9 |
| | open fails | 0/3 | 0/3 | 0/3 | 0/3 |
| Tensile crease | % change in R | 9.1 | 10.2 | 13.9 | 13.2 |
| | open fails | 0/3 | 0/3 | 0/3 | 0/3 |
| Compressive crease | % change in R | 9.3 | 9.6 | 9.4 | 8.2 |
| | open fails | 0/3 | 0/3 | 0/3 | 0/3 |

Example 6—Comparison to Inks Formulated with Different Copper Precursors and Alkanolamines To assess the effect of replacing copper hydroxide and diethanolamine with other copper precursor molecules and other alkanolamines, various inks were formulated in the same manner as ink I1 except that one or both of the copper hydroxide and diethanolamine were replaced as indicated in Table 27. The inks were deposited on Kapton™ substrates and samples were thermally sintered. Table 27 provides the results. As illustrated in Table 27, only ink I1 provided conductive copper traces when thermally sintered. All other inks resulted oxidized, non-conducting black traces. Ink I1 also provides conducting traces when photo-sintered, as described above.

TABLE 27

| Ink | Copper precursor | Alkanolamine | Thermal sintering |
|---|---|---|---|
| I1 | $Cu(OH)_2·H_2O$ | Diethanolamine | Conducting |
| C1 | $Cu(OH)_2·H_2O$ | Monoethanolamine | Oxidation, non-conducting |
| C2 | $Cu(OH)_2·H_2O$ | Triethanolamine | Oxidation, non-conducting |
| C3 | $Cu(OH)_2·H_2O$ | N-Butyldiethanol amine | Oxidation, non-conducting |
| C4 | $Cu(OH)_2·H_2O$ | 3-(Dimethylamino)-1,2-propanediol | Oxidation, non-conducting |
| C5 | $Cu(OH)_2·H_2O$ | 3-(Diethylamino)-1,2-propanediol | Oxidation, non-conducting |
| C6 | $Cu(OH)_2·H_2O$ | 2-Amino-1-butanol | Oxidation, non-conducting |
| C7 | $Cu(OH)_2·H_2O$ | Amino-2-propanol | Oxidation, non-conducting |
| C8 | $Cu(OH)_2·H_2O$ | 2-Diethylamino ethanol | Oxidation, non-conducting |
| C9 | $Cu(OH)_2·H_2O$ | 1-Dimethylamino-2-propanol | Oxidation, non-conducting |
| C10 | $Cu(OH)_2·H_2O$ | 2-Amino-2-methyl-1-propanol | Oxidation, non-conducting |
| C11 | $Cu(OH)_2·H_2O$ | 3-Diemthylamino-1-propanol | Oxidation, non-conducting |
| C12 | $Cu(OH)_2·H_2O$ | 2-(Diisopropylamino)-ethanol | Oxidation, non-conducting |
| C13 | $Cu(OH)_2·H_2O$ | Tri-isopropanolamine | Oxidation, non-conducting |
| C14 | $CuCl_2$ | Diethanolamine | Oxidation, non-conducting |

TABLE 27-continued

| Ink | Copper precursor | Alkanolamine | Thermal sintering |
|---|---|---|---|
| C15 | CuCl$_2$ | Monoethanolamine | Oxidation, non-conducting |
| C16 | CuCl$_2$ | 3-(Diethylamino)-1,2-propanediol | Oxidation, non-conducting |
| C17 | CuCl$_2$ | 2-Amino-1-butanol | Oxidation, non-conducting |
| C18 | CuSO$_4$ | Diethanolamine | Oxidation, non-conducting |
| C19 | CuSO$_4$ | Monoethanolamine | Oxidation, non-conducting |
| C20 | CuSO$_4$ | 3-(Diethylamino)-1,2-propanediol | Oxidation, non-conducting |
| C21 | CuSO$_4$ | 2-Amino-1-butanol | Oxidation, non-conducting |
| C22 | Cu oxalate hemihydrate | Diethanolamine | Oxidation, non-conducting |
| C23 | Cu oxalate hemihydrate | Monoethanolamine | Oxidation, non-conducting |
| C24 | Cu oxalate hemihydrate | 3-(Diethylamino)-1,2-propanediol | Oxidation, non-conducting |
| C25 | Cu oxalate hemihydrate | 2-Amino-1-butanol | Oxidation, non-conducting |

Example 7—Cost Comparison of Inks

To illustrate the cost efficiency of copper inks, the costs of copper hydroxide/diethanolamine inks of the present invention were compared to the cost of the ink if the copper hydroxide is replaced by other popular MOD compounds, namely copper formate tetrahydrate and silver neodecanoate. Table 28 illustrates a cost comparison (in Canadian dollars) when the ink comprises a copper nanoparticle (CuNP) filler and Table 29 illustrates a cost comparison (in Canadian dollars) when the ink comprises a silver nitrate (AgNO$_3$) filler. The lowest catalogue price for the copper salts was from Alfa and the lowest catalogue price for silver neodecanoate was from Gelest Inc. Further, 1 g of copper hydroxide has 65.12% Cu, 1 g of copper formate has 28% Cu, and 1 g of silver neodecanoate has 38.64% Ag; therefore, the per gram metal precursor price was scaled to a metal content of 65%.

As illustrated in Table 28 an ink based on copper hydroxide and filled with copper nanoparticles is more than about 8× less expensive than a similar ink based on copper formate and more than about 42× less expensive than a similar ink based on silver neodecanoate. Even when a silver salt is used as a filler, as illustrated in Table 29, the ink based on copper hydroxide is more than 4× less expensive than the ink based on copper formate and more than 21× less expensive than the ink based on silver neodecanoate.

TABLE 28

| Lowest catalogue price | Ratio | Cost Copper hydroxide ink | Cost Copper formate ink | Cost Silver neodecanoate ink |
|---|---|---|---|---|
| Metal precursor | 1 g | $0.075 | $1.64 | $8.75 |
| Diethanolamine | 3 g | $0.084 | $0.084 | $0.084 |
| CuNP | 0.1 g | $0.05 | $0.05 | $0.05 |
| Total for ink | 4.1 g | $0.209 | $1.774 | $8.88 |
| Per gram for ink | 1 g | $0.051 | $0.43 | $2.16 |

TABLE 29

| Lowest catalogue price | Ratio | Cost Copper hydroxide ink | Cost Copper formate ink | Cost Silver neodecanoate ink |
|---|---|---|---|---|
| Metal precursor | 1 g | $0.075 | $1.64 | $8.75 |
| Diethanolamine | 3 g | $0.084 | $0.084 | $0.084 |
| AgNO$_3$ | 0.1 g | $0.26 | $0.26 | $0.26 |
| Total for ink | 4.1 g | $0.419 | $1.984 | $9.90 |
| Per gram for ink | 1 g | $0.102 | $0.483 | $2.21 |

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A method of producing a conductive copper coating on a substrate, the method comprising:
   coating a substrate with a copper-based ink comprising copper hydroxide and diethanolamine, wherein the copper hydroxide and diethanolamine form a complex in the ink and are in a molar ratio of about 1:2.5 to about 1:3.5, wherein the complex comprises two hydroxide ions and the diethanolamine coordinated to a copper ion; and,
   decomposing the ink on the substrate to form a conductive copper coating on the substrate.

2. The method of claim 1, wherein the molar ratio is about 1:3.

3. The method of claim 1, wherein the copper hydroxide comprises copper hydroxide monohydrate in an amount that provides about 5 wt % to about 40 wt % of copper in the ink, based on total weight of the ink.

4. The method of claim 1, wherein in the ink further comprises a metal filler.

5. The method of claim 4, wherein the metal filler is in the ink in an amount of about 1 wt % to about 40 wt %, based on weight of the copper from the copper hydroxide.

6. The method of claim 4, wherein the metal filler comprises copper nanoparticles, silver nitrate or a mixture thereof.

7. The method of claim 1, wherein the ink further comprises a solvent and a binder.

8. The method of claim 7, wherein the binder comprises a hydroxide-and/or carboxyl-terminated polyester.

9. The method of claim 1, wherein the ink on the substrate is dried at a temperature of about 100-150° C. for a time of about 10-45 minutes.

10. The method of claim 1, wherein the decomposing comprises photo-sintering.

11. The method of claim 1, wherein the coating of the ink on the substrate comprises screen printing.

12. The method of claim 1, wherein the ink contains no formic acid or formate ions.

13. A copper-based ink comprising copper hydroxide and diethanolamine, wherein the copper hydroxide and diethanolamine form a complex in the ink and are in a molar ratio of about 1:2.5 to about 1:3.5, wherein the complex comprises two hydroxide ions and the diethanolamine coordinated to a copper ion.

14. The ink of claim 13, wherein the molar ratio is about 1:3.

15. The ink of claim 13, further comprising a metal filler.

16. The ink of claim 15, wherein the metal filler is in the ink in an amount of about 1 wt % to about 40 wt %, based on weight of the copper from the copper hydroxide.

17. The ink of claim 15, wherein the metal filler comprises copper nanoparticles, silver nitrate or a mixture thereof.

18. The ink of claim 13, further comprising a solvent and a binder.

19. The ink of claim 18, wherein the binder comprises a hydroxide- and/or carboxyl-terminated polyester.

20. The ink of claim 13, wherein the ink contains no formic acid or formate ions.

21. An electronic device comprising a substrate having a conductive copper coating thereon produced by the method as defined in claim 1.

\* \* \* \* \*

UNITED STATES PATENT AND TRADEMARK OFFICE
CERTIFICATE OF CORRECTION

| | |
|---|---|
| PATENT NO. | : 11,505,712 B2 |
| APPLICATION NO. | : 16/634934 |
| DATED | : November 22, 2022 |
| INVENTOR(S) | : Bhavana Deore, Chantal Paquet and Patrick Malenfant |

It is certified that error appears in the above-identified patent and that said Letters Patent is hereby corrected as shown below:

In the Specification

Column 1, Line 7, the application number 'PCT/162018/055727' should read -PCT/IB2018/055727-.

Signed and Sealed this
Twenty-ninth Day of August, 2023

Katherine Kelly Vidal
*Director of the United States Patent and Trademark Office*